United States Patent
Canyon et al.

(10) Patent No.: US 6,784,748 B1
(45) Date of Patent: Aug. 31, 2004

(54) POWER AMPLIFYING SYSTEM WITH SUPPLY AND BIAS ENHANCEMENTS

(75) Inventors: James C. Canyon, San Diego, CA (US); Stephan M. Rohlfing, Newbury Park, CA (US)

(73) Assignee: Skyworks Solutions, Inc., Newport Beach, CA (US)

( * ) Notice: Subject to any disclaimer, the term of this patent is extended or adjusted under 35 U.S.C. 154(b) by 0 days.

(21) Appl. No.: 10/167,530

(22) Filed: Jun. 11, 2002

Related U.S. Application Data

(63) Continuation-in-part of application No. 09/792,660, filed on Feb. 23, 2001.
(60) Provisional application No. 60/184,682, filed on Feb. 24, 2000.

(51) Int. Cl.[7] .............................. H03G 3/30
(52) U.S. Cl. ................. 330/296; 330/297; 330/285
(58) Field of Search .................. 330/51, 285, 296, 330/297

(56) References Cited

U.S. PATENT DOCUMENTS 5,079,517 A * 1/1992 Bader ................... 330/285
5,994,964 A * 11/1999 Tanemura ................ 330/285
6,081,161 A * 6/2000 Dacus et al. ............. 330/297

OTHER PUBLICATIONS

M. Ranjan, K.H. Koo. G. Hanington. C. Fallesen and P. Asbeck. "Microwave Power Amplifiers with Digitally–Controlled Power Supply Voltage for High Efficiency and High Linearity".

G. Hanington. A. Metzger. P. Asbeck and II. Finaly, "Integrated DC–DC converter using GaAs HBT technology" Electronics Letters, Nov. 25, 1999, vol. 35, No. 24.

* cited by examiner

Primary Examiner—Steven J. Mottola
(74) Attorney, Agent, or Firm—Thomas, Kayden, Horstemeyer & Risley, LLP

(57) ABSTRACT

A radio frequency (RF) power amplifying system. The power amplifying system includes a power controller and power amplifiers comprising power transistors and bias circuitry. The bias circuitry provides current to the base of the one or more power transistors in such as manner as to automatically maintain the power transistors in substantially linear operation throughout the variation in voltage as supplied by the power controller.

29 Claims, 8 Drawing Sheets

POWER AMPLIFYING SYSTEM WITH SUPPLY AND BIAS ENHANCEMENTS

CLAIM OF PRIORITY

This application is a continuation-in-part of copending U.S. utility application entitled, "Power Amplifier With Provisions For Varying Operating Voltage Based Upon Power Amplifier Output Power," having Ser. No. 09/792,660, filed Feb. 23, 2001, which claims priority to U.S. provisional application entitled, "A Power Amplifying System," having Ser. No. 60/184,682, filed Feb. 24, 2000, both which are entirely incorporated herein by reference.

BACKGROUND OF THE INVENTION

1. Field of the Invention

This invention relates generally to wireless communication devices, and more specifically, to a radio frequency power amplifying system.

2. Related Art

In personal communications devices such as cellular telephones, there is a trend toward minimizing size and weight. The size and weight are, however, contingent upon the size and weight of the various components that make up the personal communications device. Briefly, the smaller the various components of the personal communications devices, the smaller the size and overall weight of the personal communications device. Many personal communications devices have an overall size and weight that is, to a large degree, dominated by the size and weight of the battery that provides a supply voltage to the personal communications device. This is so because consumers want personal communications devices to have a prolonged operating time during usage.

As operating time requirements and power consumption of the personal communications device during operations increase, the size of the battery required to perform under these circumstances will also increase. Thus, the reduction of current and power consumption in the personal communications devices and the reduction in the size of components leads to a reduced battery size. Alternatively, where the size of the battery remains constant, the operating time of the personal communications devices can be increased.

In typical personal communications devices such as, for example, a portable transceiver, efficiency of the device is optimized at a maximum power output without regard to whether or not the maximum power output is actually needed. Thus, as the power output of a typical transceiver drops below the maximum power output level, the efficiency of the transceiver also drops. This reduces the battery voltage and thus limits the operation time of the transceiver.

Therefore, there exists a need in the industry for a power amplifying system that makes efficient use of broad operating power ranges.

SUMMARY

The invention provides a radio frequency (RF) power amplifying system for a personal communications device. In one embodiment, the power amplifying system includes a power controller and one or more power amplifiers comprising power transistors and bias circuitry. The bias circuitry is decoupled from the collector terminals of the power transistors to enable substantially reduced supply voltages and consequently a reduced power consumption for the power amplifiers. The bias circuitry provides current to the base of the one or more power transistors in such a manner as to maintain the power transistors in substantially linear operation throughout the variation in collector supply voltage as supplied by the power controller.

In one embodiment, the bias circuit is supplied with a reference voltage that is independent of the regulated supply voltage provided by the power controller. The power controller monitors the current draw of the bias circuit of each power amplifier. The supply voltage is automatically adjusted based on the current draw of the bias circuit, which is proportional to the power output level of each power amplifier. The bias circuit provides substantially constant current to the base terminals of the power transistors for each predefined power output level of each power amplifier, thus maintaining substantially linear operation of the power transistor.

In another embodiment, the supply voltage from the power controller and a separate reference voltage are both fed to the bias circuit. The supply voltage from the power controller acts as a "control signal" to the bias circuit, causing the bias circuit current to vary automatically as a function of the supply voltage, thus automatically adjusting the bias point of the power transistors to maintain substantially linear operation.

Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE DRAWINGS

The invention can be better understood with reference to the following figures. The components in the figures are not necessarily to scale, emphasis instead being placed upon illustrating the principles of the invention. In the figures, like reference numerals designate corresponding parts throughout the different views.

DETAILED DESCRIPTION

Figure 6:
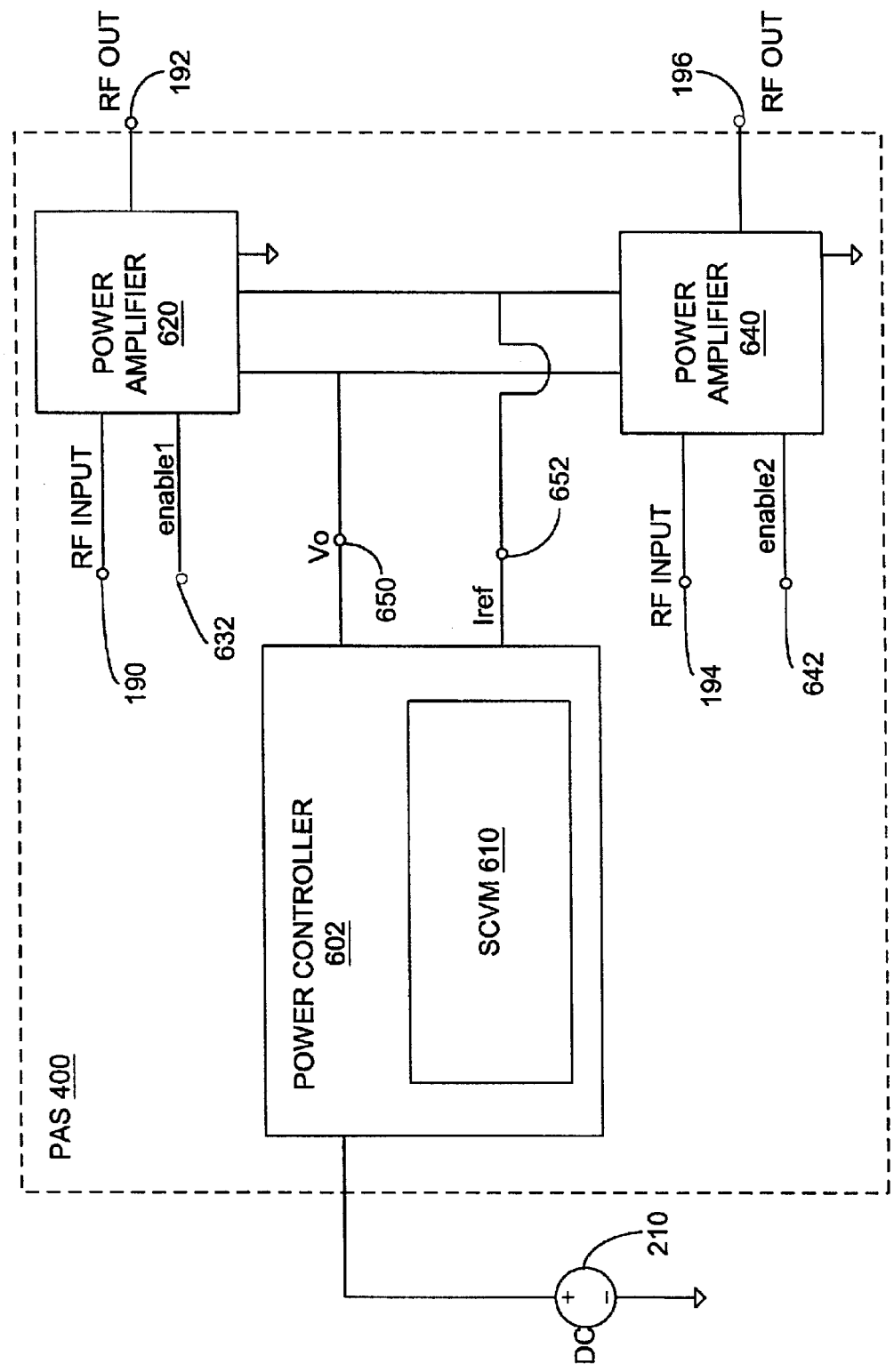
FIG. 6 is a block diagram illustrating a third exemplary power amplifying system.
Figure 7:
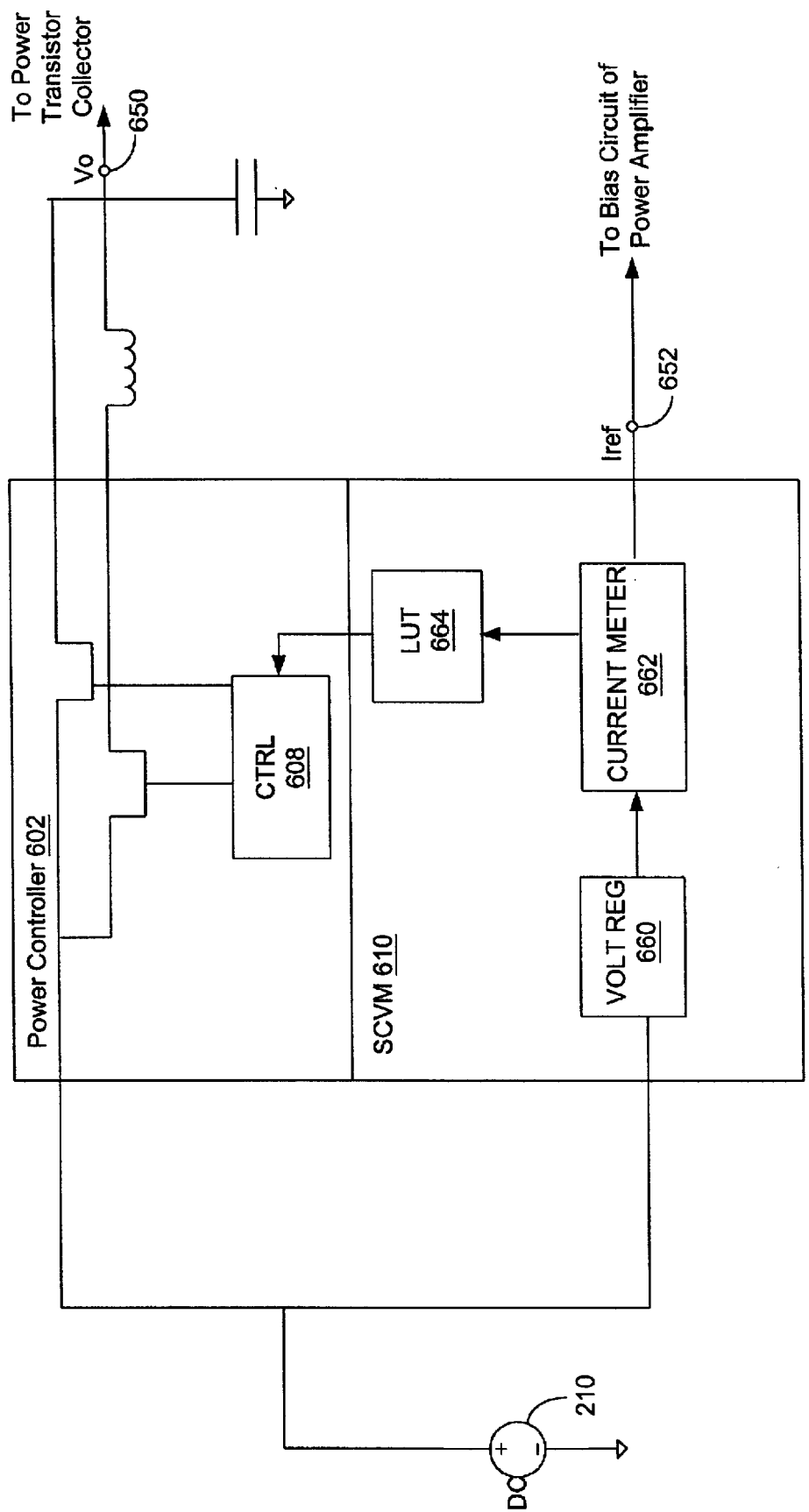
FIG. 7 is a detailed block diagram of the power controller of the third exemplary power amplifying system of FIG. 6.

The invention provides a radio frequency (RF) power amplifying system (PAS) for a personal communications device. An example system using the PAS will be described in association with FIG. 1, with a further description of an example PAS described in association with FIG. 2. Decoupled bias circuitry for one of the power amplifiers of the PAS will be described in accordance with one embodiment of the invention in association with FIG. 3. FIGS. 4–8 will then be used to describe various embodiments of the PAS based on various mechanisms for controlling the PAS. For example, in FIGS. 4 and 5, the bias circuit will be described in cooperation with Vmode control. In one embodiment, Vmode control is accomplished through a transceiver controller or a baseband subsystem communication, such as for example, through a Vmode pin. FIGS. 4 and 6 and 7 will be used to illustrate the monitoring of current (Iref) to determine the output power delivered by the power amplifier of the PAS. This current can be used to adjust the voltage supplied by a power controller to the collector supply of a power amplifier transistor automatically, thus substantially reducing, or even eliminating, the need for the baseband subsystem to control power controller output to the power amplifier of the PAS. Finally, FIG. 8 will be used to describe a PAS wherein the Vmode pin is added to the Iref, which can then be controlled by the baseband subsystem. Although described with particular reference to a personal communications device, the power amplifying system can be implemented in any system where it is desirable to reduce power consumption while maintaining efficient, substantially linear operation in a power amplification system. Thus, the power amplifying system can be embodied in many different forms and should not be construed as limited to the embodiments set forth below. Rather, these embodiments are provided so that this disclosure will be thorough and complete, and will fully convey the scope of the invention to those skilled in the art. Furthermore, all "examples" given herein are intended to be non-limiting.

Figure 1:
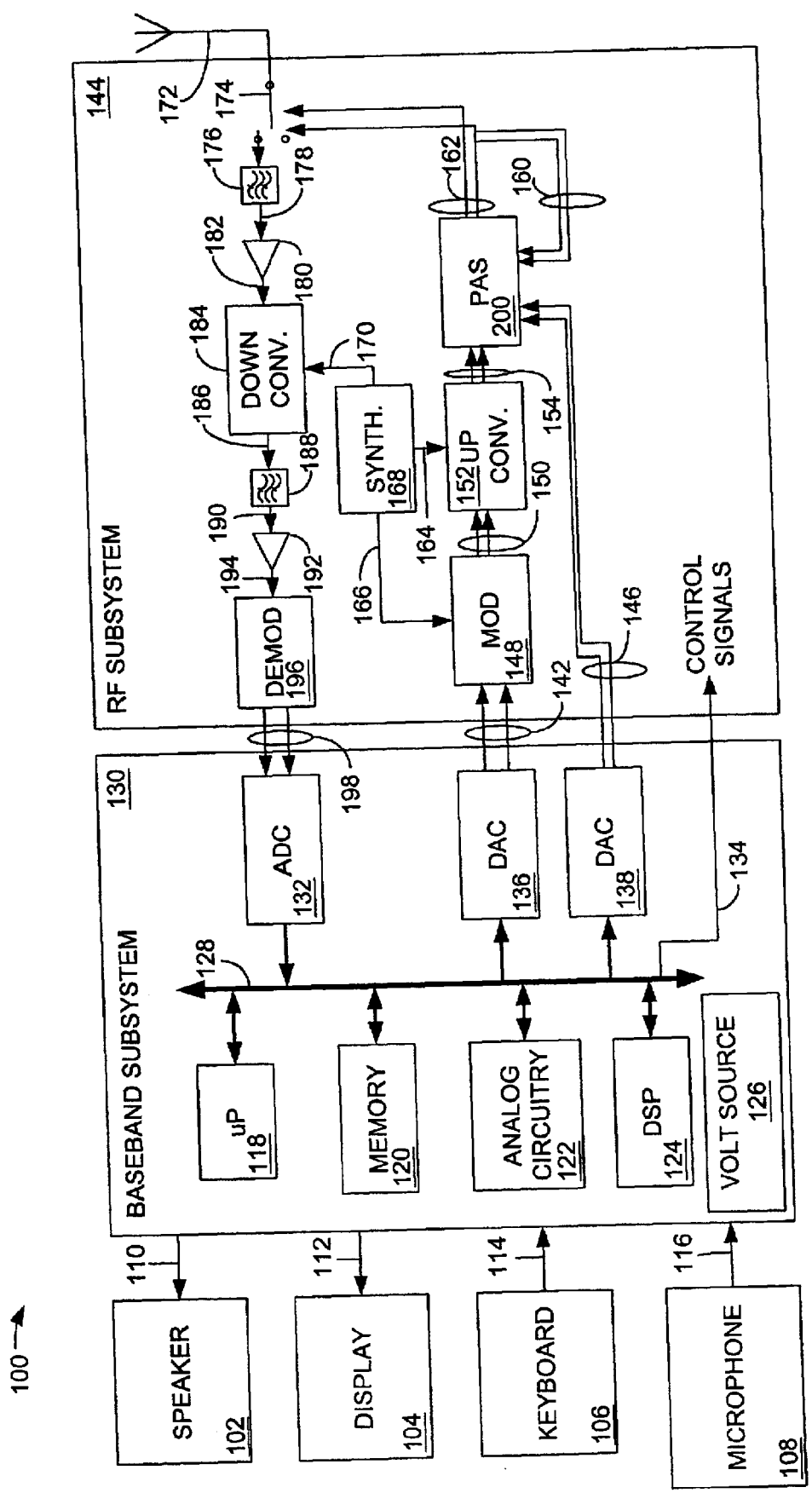
FIG. 1 is a block diagram illustrating a simplified portable transceiver.

FIG. 1 is a block diagram illustrating a simplified portable transceiver 100. Portable transceiver 100 includes speaker 102, display 104, keyboard 106, and microphone 108, all connected to baseband subsystem 130. In a particular embodiment, portable transceiver 100 can be, for example but not limited to, a portable telecommunication handset such as a mobile cellular-type telephone. Speaker 102 and display 104 receive signals from baseband subsystem 130 via connections 110 and 112, respectively, as known to those having ordinary skill in the art. Similarly, keyboard 106 and microphone 108 supply signals to baseband subsystem 130 via connections 114 and 116, respectively. Baseband subsystem 130 includes microprocessor (µP) 118, memory 120, analog circuitry 122, and digital signal processor (DSP) 124 in communication via bus 128, as well as a power source 126, such as a battery or charging circuit, which will power the baseband subsystem 130 and the RF subsystem 144. Generally, the baseband subsystem 130 is the controller for substantially all functions of a cell phone. Bus 128, although shown as a single bus, may be implemented using multiple busses connected as necessary among the subsystems within baseband subsystem 130. Microprocessor 118 and memory 120 provide the signal timing, processing and storage functions for portable transceiver 100. Analog circuitry 122 provides the analog processing functions for the signals within baseband subsystem 130. Baseband subsystem 130 provides control signals to RF subsystem 144 via connection 134. Although shown as a single connection 134, the control signals may originate from DSP 124 or from microprocessor 118, and are supplied to a variety of points within RF subsystem 144. It should be noted that, for simplicity, only the basic components of portable transceiver 100 are illustrated.

Baseband subsystem 130 also includes analog-to-digital converter (ADC) 132 and digital-to-analog converters (DACs) 136 and 138. ADC 132, DAC 136 and DAC 138 also communicate with microprocessor 118, memory 120, analog circuitry 122 and DSP 124 via bus 128. DAC 136 converts the digital communication information within baseband subsystem 130 into an analog signal for transmission to RF subsystem 144 via connection 142. DAC 138 provides a reference voltage power level signal or signals to the power amplifying system 200 via connection 146. Connection 142, shown as two directed arrows, includes the information that is to be transmitted by RF subsystem 144 after conversion from the digital domain to the analog domain.

RF subsystem 144 includes modulator 148, which after receiving a frequency reference signal or signals, also called a local oscillator signal or LO from synthesizer 168 via connection 166, modulates the analog information on connection 142 and provides a modulated signal via connection 150 to upconverter 152. Upconverter 152 also receives a frequency reference signal from synthesizer 168 via connection 164. Synthesizer 168 determines the appropriate frequency to which upconverter 152 can upconvert the modulated signal or signals on connection 150. The synthesizer 168, in a code division multiple access (CDMA) embodiment, receives instructions from the baseband subsystem 130 as to what band, personal communications service (PCS), or cellular (CELL), to implement (as indicated by control signals 134). Further, as will be described below, the baseband subsystem 130 controls a power controller (not shown) of the power amplifying system (PAS) 200 through the control signal 134. The modulated signal or signals on connection 150 may be any modulated signal, such as a phase modulated signal or an amplitude modulated signal. Furthermore, it is possible to supply a phase modulated signal to upconverter 152 and to introduce an amplitude modulated signal component into the PAS 200 through the power amplifiers control channel. All possible modulation techniques can benefit from the invention to be described below.

Upconverter 152 supplies the modulated signal or signals via connection 154 to PAS 200. Although a single antenna port for antenna 172 is illustrated for simplicity in discussion, it will be appreciated by one having ordinary skill in the art that in a full-duplex transceiver, such as that used in CDMA, the simultaneous transmit/receive signal is accomplished, in one implementation, through the use of a diplexer filter (not shown). The diplexer filter will typically route one set of bands to a first port (not shown), and a second set to a second port (not shown), thus acting as a three port device (e.g., the antenna port handling all frequencies, a receive port handling receive signals, and a transmit port handling transmit frequencies). Note that for PCS, there are typically two sets of these signals and therefore the transceiver is typically a five port device, as is well known in to those having ordinary skill in the art. The PAS 200 comprises one or more power amplifiers (not shown) and a power controller (not shown), as will be described below. The PAS 200 amplifies the signal or signals on connection 154 to a variety of different power levels while maintaining a high efficiency level. The PAS 200 amplifies the modulated signal(s) on connection 154 to the appropriate power level for transmission via connection 162 to antenna 172. Connection 162 may include an interface, such as, for example, an isolator or a filter. Illustratively, switch 174 controls whether the amplified signal on connection 162 is transferred to antenna 172 or whether a received signal from antenna 172 is supplied to filter 176. In one embodiment, the operation of switch 174 is controlled by a control signal from baseband subsystem 130 via connection 134. In other embodiments, as described above, a full-duplex communication architecture can be used to simultaneously send and receive signals.

In one embodiment, a portion of the amplified transmit signal energy on connection 162 is supplied via connection 160 to the power controller (not shown) of the PAS 200. The power controller can form a closed power control feedback loop, as will be described below. As mentioned above, a signal received by antenna 172 will, at the appropriate time determined by baseband system 130, be directed via switch 174 to receive filter 176. Receive filter 176 will filter the received signal and supply the filtered signal on connection 178 to low noise amplifier (LNA) 180. Receive filter 176 is a bandpass filter, which passes all channels of the particular cellular system in which the portable transceiver 100 is operating. As an example, in a 900 MHz GSM system (global system for mobile communications), receive filter 176 would pass all frequencies from 935.1 MHz to 959.9 MHz, covering all 124 contiguous channels of 200 kHz each. The purpose of this filter is to reject all frequencies outside the desired region. LNA 180 amplifies the weak signal on connection 178 to a level at which downconverter 184 can translate the signal from the transmitted frequency back to a baseband frequency. Alternatively, the functionality of LNA 180 and downconverter 184 can be accomplished using other elements, such as for example but not limited to, a low noise block downconverter (LNB).

Downconverter 184 receives a frequency reference signal, also called a local oscillator signal or LO from synthesizer 168, via connection 170. This LO signal instructs the downconverter 184 as to the proper frequency to which to dowhconvert the signal received from LNA 180 via connection 182. The downconverted frequency is called the intermediate frequency or "IF". Downconverter 184 sends the downconverted signal via connection 186 to channel filter 188, also called the "IF filter". Channel filter 188 filters the downconverted signal and supplies it via connection 190 to amplifier 192. The channel filter 188 selects the one desired channel and rejects all others. Using the GSM system as an example, only one of the 124 contiguous channels is actually to be received. After all channels are passed by receive filter 176 and downconverted in frequency by downconverter 184, only the one desired channel will appear precisely at the center frequency of channel filter 188. The synthesizer 168, by controlling the local oscillator frequency supplied on connection 170 to downconverter 184, determines the selected channel. Amplifier 192 amplifies the received signal and supplies the amplified signal via connection 194 to demodulator 196. Demodulator 196 recovers the transmitted analog information and supplies a signal representing this information via connection 198 to ADC 132. ADC 132 converts these analog signals to a digital signal at baseband frequency and transfers it via bus 128 to DSP 124 for further processing.

Figure 2:
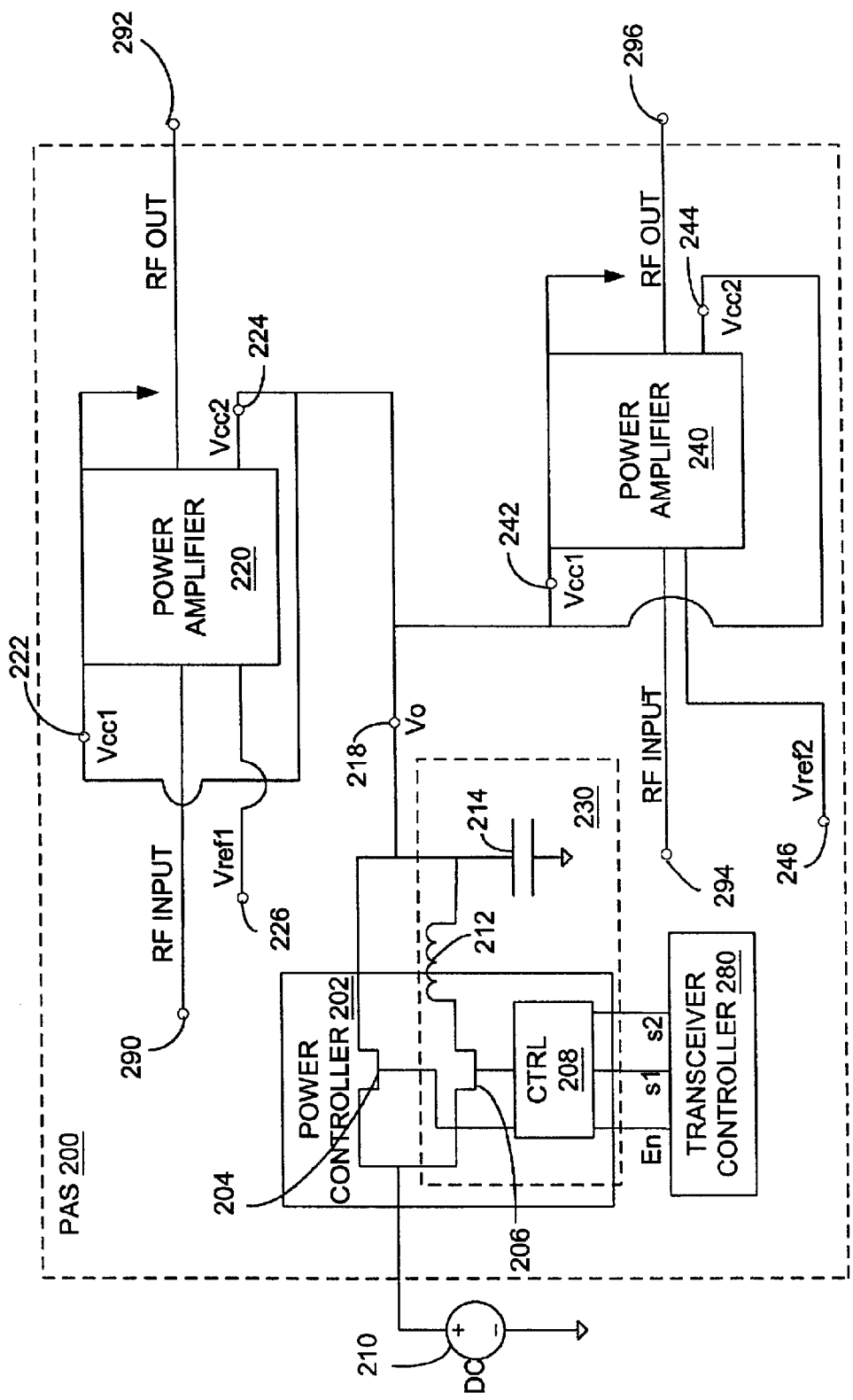
FIG. 2 is a block diagram illustrating an exemplary radio frequency (RF) power amplifying system for a personal communications device.

FIG. 2 is a block diagram illustrating one example power amplifying system (PAS) 200 for the portable transceiver 100 of FIG. 1. The portable transceiver 100 (FIG. 1) can be, for example, a portable dual band, triple mode phone that provides advanced mobile phone system (AMPS), cellular, cellular code division mobile access (CDMA), and/or personal communications system (PCS) CDMA. PAS 200 is a subsystem of portable transceiver 100 (FIG. 1), and PAS 200 includes power controller 202, a first power amplifier 220, and a second power amplifier 240. In a portable transceiver 100 such as a dual mode phone providing PCS CDMA and cellular CDMA, for instance, first power amplifier 220 can be used to amplify RF signals at a frequency of 1900 mega hertz (MHz) and second power amplifier 240 can be used to amplify RF signals at a frequency of 860 MHz. Although shown and described with two power amplifiers, fewer or greater numbers of power amplifiers can be implemented while still being within the scope of the embodiments of the invention.

Power controller 202 receives energy from a voltage supply, such as battery 210. Battery 210 can be external or internal to portable transceiver 100 (such as, for example, voltage source 126 of FIG. 1), as well as internal or external to the PAS 200. Power controller 202 integrates power supply and battery charging functions for the PAS 200. In one embodiment, the power controller 202 includes a bypass switch 204, regulator switch 206, and voltage controller 208. Bypass switch 204 and regulator switch 206 can be implemented using one or more field effect transistors (FETs). However, other transistor devices, such as bipolar junction transistors (BJTs) can be used. In other embodiments, electrically actuated mechanical switching devices can be used.

Regulator switch 206, voltage controller 208, inductor 212, and capacitor 214 comprise a regulator circuit 230. The regulator circuit 230 receives energy from battery 210, and reduces the voltage to a predetermined regulated supply voltage, supply voltage Vo at node 218 as determined by a transceiver controller 280, as will be explained below. Note that the downward pointing, open arrow below the battery 210, and as depicted in other drawings, will be understood to designate ground. The voltage supply Vo, at node 218, can be selected from any one of a predetermined number of voltage levels. For example, Vo can be between 0 volts and the voltage at the battery 210. Further, Vo may be linearly variable between, for example, 0 volts and the voltage at the battery 210, in accordance with a logic control input level provided by transceiver controller 280, as will be described below.

The transceiver controller 280 determines the voltage that the power controller 202 will supply to the power amplifiers 220 and 240, and accordingly selects the logic control input level (via inputs En, s1, and s2) to effect the desired power output level of the selected power amplifier. The appropriate power amplifier 220 or 240 is selected by the baseband subsystem 130 (FIG. 1) controlling the Vref voltage to the appropriate pin Vref1 226 or Vref2 246. Thus, in one embodiment, the transceiver controller 280 is controlled by the baseband subsystem 130 (FIG. 1). The baseband subsystem 130 typically determines how much power the power amplifier 220 or 240 will output, typically by adjusting an analog automatic gain control (AGC) pin that goes to a transistor IC (not shown) prior to the power amplifier (220 or 240). As the input power to the power amplifier (220 or 240) increases, the power output also increases because the power amplifier will typically have a nearly constant gain. Note that, for cellular transmission, a pilot tone is typically transmitted in order to control the transmit power of the cell phone. Utilizing the pilot tone, the baseband subsystem 130 (FIG. 1) will adjust the transmit output power. The transceiver controller 280 can be external to the power controller 202 or internal to power controller 202. Further, the transceiver controller 280 can be external or internal to PAS 200. The power controller 202 operates by passing various ranges of voltages to either of the power amplifiers 220 and 240 based on the required power output determined by the transceiver controller 280. In other embodiments, the transceiver controller 280 can sense current consumption, reference current, or the actual power at the output of a first or second stage (not shown).

When a maximum power output is required from either power amplifier 220 or 240, the transceiver controller 280 provides a logic control input (via En, s1, s2) to the voltage controller 208, which causes bypass switch 204 to turn on (i.e., to close) and regulator switch 206 to also close to help minimize the voltage drop across the switches (e.g., 204 and 206). For example, when either power amplifier is drawing current that results in a power amplification of greater than 22–24 decibels relative to one milliwatt (dBm), the transceiver controller 280 provides a logic control input to the voltage controller 208 to close the bypass switch 204. When the switches 204 and 206 are closed, the supply voltage Vo at node 218 applied to the enabled power amplifier (i.e., either power amplifier 220 or 240 depending on instructions from the transceiver controller 280) is effectively taken to a level approximately equal to the voltage level of the battery 210 for maximum power output by the enabled power amplifier.

When the power output requirement for transmission is less than maximum, the transceiver controller 280 provides one of several different logic control input levels to the voltage controller 208, which causes the regulator circuit 230 to operate while the bypass switch 204 is off. Regulator circuit 230 receives current to charge inductor 212 and capacitor 214. When the capacitor 214 reaches one of the specified voltage control input levels from transceiver controller 280, regulator switch 206 opens and inductor 212 replenishes the voltage discharged by capacitor 214 to ground in order to maintain the specified supply voltage Vo at node 218. When the voltage level Vo at node 218 declines below the level specified by the transceiver controller 280, regulator switch 206 closes to charge the regulator circuit 230. In one embodiment, the regulator circuit 230 outputs a supply voltage Vo of approximately 2.2 volts (DC) when the transceiver controller 280 provides a logic control input level that indicates that the enabled power amplifier is operating at a power level of less than, for example, 22 dBm and greater than 16 dBm.

Voltage Vo is supplied to power amplifier 220 at node Vcc1 222 and node Vcc2 224. Similarly, Vo is supplied to power amplifier 240 at node Vcc1 242 and node Vcc2 244. The embodiment of FIG. 2 uses a well-regulated reference voltage to switch from power amplifier 220 to power amplifier 240 (e.g., from PCS to Cellular). The reference voltage Vref2 at node 246 may be a control, or reference, voltage of 3.0 V, for example, that is used to turn on, or enable, the cellular power amplifier 240 when required. For instance, reference voltage Vref2 can be the reference voltage supplied on one of the lines of connection 146 of FIG. 1. Similarly, the reference voltage Vref1 at node 226 may be a control, or reference, voltage of 3.0V, for example, that is used to turn on the power amplifier 220. A 0V value for reference voltage Vref2 at node 246 or reference voltage Vref1 at node 226 disables, or turns off, the corresponding power amplifier 240 or 220. Reference voltages Vref2 and Vref1 are controlled, in one implementation, by the transceiver controller 280, as discussed above.

Power amplifier 220 includes an input node 290 for receiving a radio frequency (RF) signal and an output node 292 for outputting an amplified RF signal. Similarly, power amplifier 240 includes an input node 294 for receiving a radio frequency (RF) signal and an output node 296 for outputting an amplified RF signal. Input nodes 290 or 294 can be, for instance, the input connection 154 in FIG. 1. Similarly, the output nodes 292 or 296 can be output connection 162 of FIG. 1. Power amplifiers 220 and 240 can be fabricated using gallium arsenide (GaAs) semiconductor technology. The power controller 202 can be fabricated using complementary metal oxide semiconductor (CMOS) technology. Further, both power amplifier 220 and 240 and power controller 202 can be fabricated on a single integrated circuit, or each component on separate integrated circuits.

Figure 3:
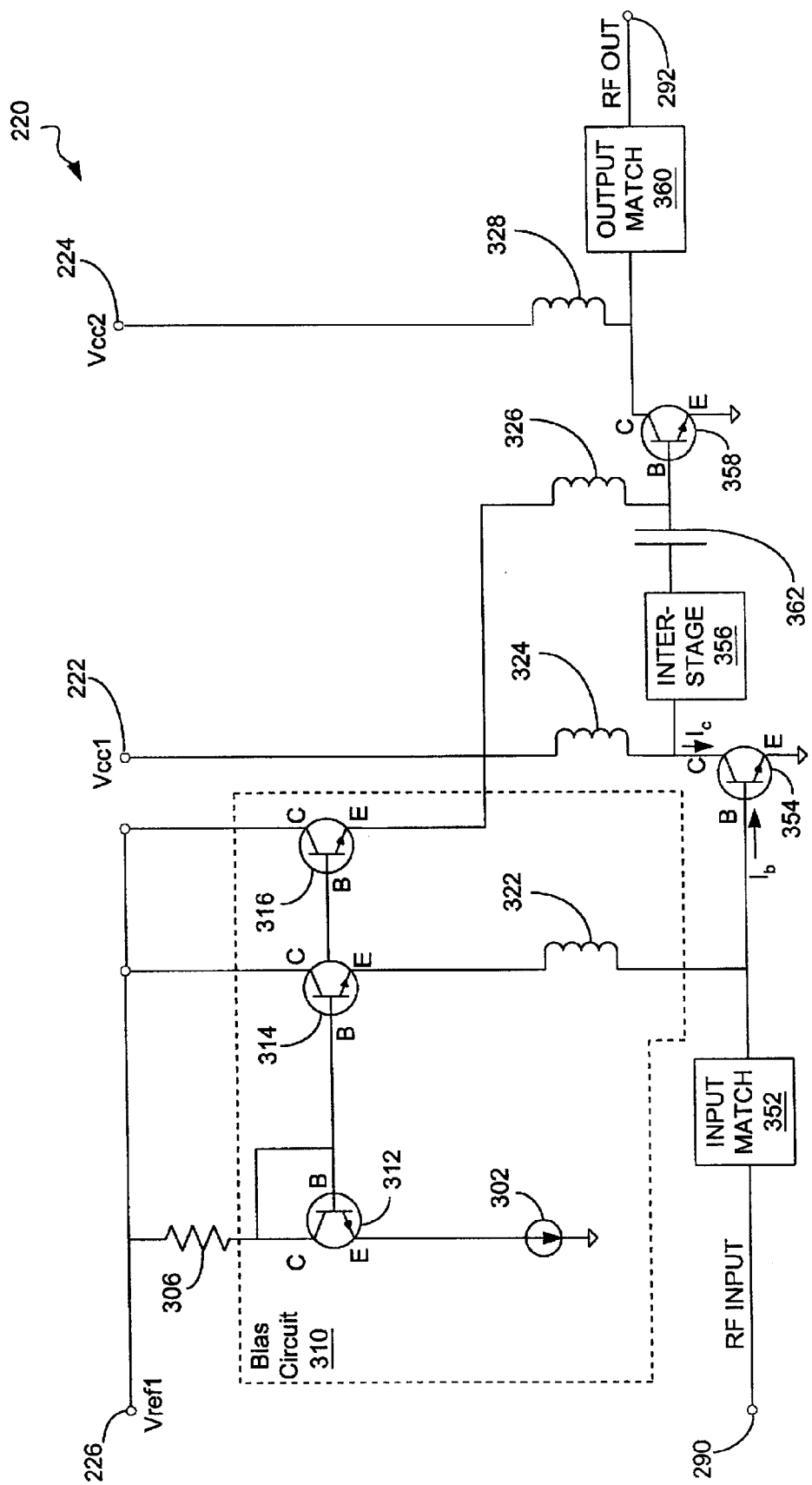
FIG. 3 is a schematic diagram illustrating decoupled bias circuitry for one of the power amplifiers of the power amplifying system of FIG. 2.
Figure 4:
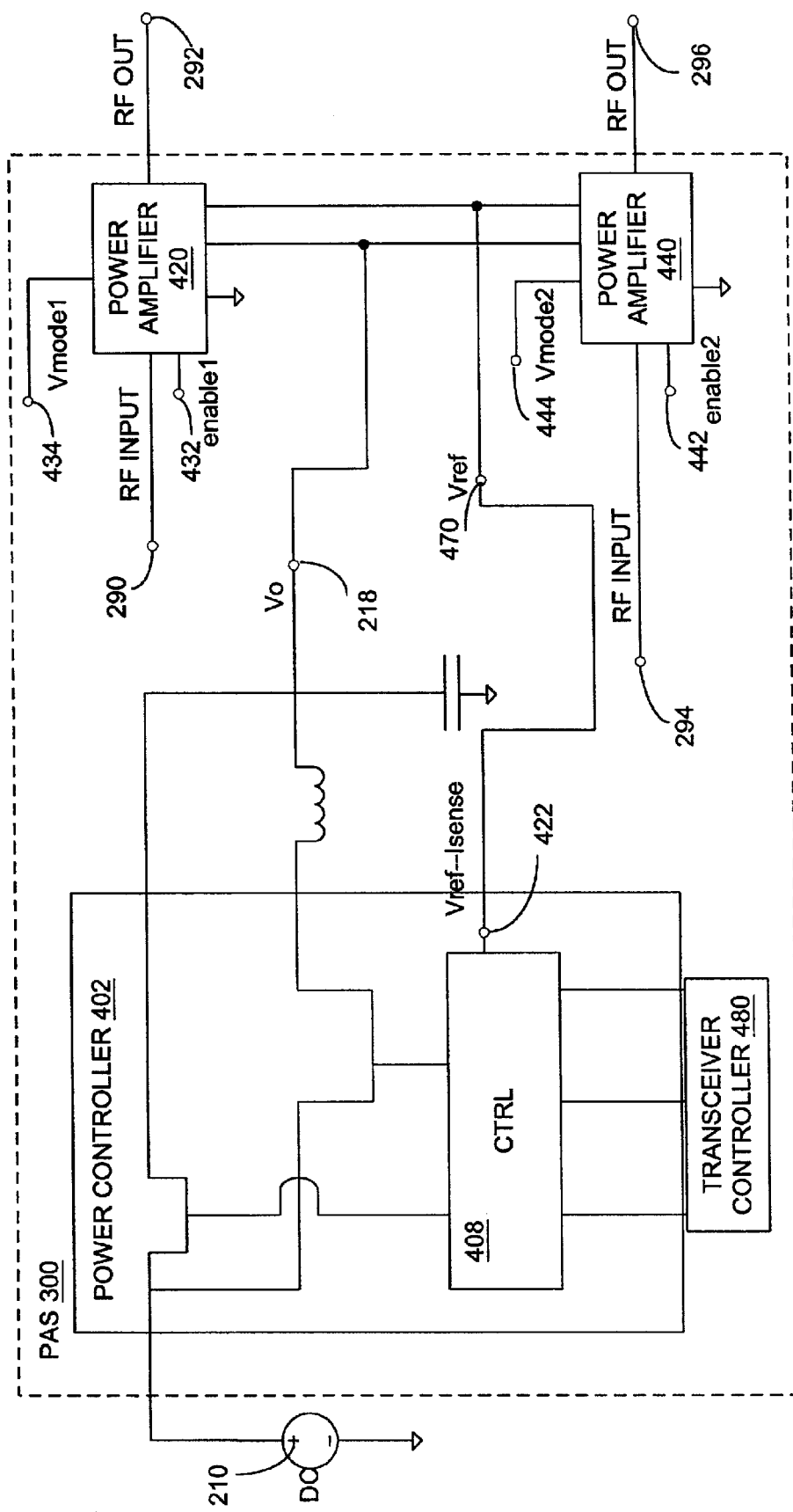
FIG. 4 is a block diagram illustrating a second exemplary power amplifying system.

FIG. 3 is a schematic diagram illustrating decoupled bias circuitry for the power amplifier 220 of the exemplary PAS 200 of FIG. 2. In this example, power amplifier 220 includes a bias circuit 310 and multi-stage RF power transistor circuitry. Although shown with two transistor stages, a fewer or greater number of stages are contemplated to be within the scope of the embodiments of the invention. Further, although described in association with power amplifier 220, the same or similar description for power amplifier 220 can be applied to power amplifier 240 (FIG. 2) or like embodiments. Power amplifier 220 includes an input matching unit 352 for matching the impedance of the input node 290 to a first stage power transistor 354. Note that the first stage power transistor 354, as well as other bipolar junction transistors (BJTs) contained in the embodiments described within this document, comprises a base terminal designated by the letter "B", a collector terminal designated by the letter "C", and an emitter terminal designated by the letter "E". The output of power transistor 354 is connected to a second stage (inter-stage) matching unit 356. Inter-stage matching unit 356 matches the output impedance of power transistor 354 to the input impedance of a second stage power transistor 358. An output matching unit 360 is provided to match the output impedance of power transistor 358 to the output node 292. Matching units 352, 356, and 360 can be implemented in hardware, such as discrete or integrated passive or active elements, or in software, or a combination of hardware and software, as would be appreciated by one having ordinary skill in the art.

The reference voltage Vref1 at node 226 is coupled to bias circuit 310 via resistor 306. Bias circuit 310 is energized by providing the reference voltage Vref1 as described in association with FIG. 2, from a power controller (similar to the power controller 202 of FIG. 2), or by providing an enable input or by applying a battery voltage, such as from battery 210 of FIG. 2, as will be described below. Note that, in one embodiment, Vref1 is independent of RF transistor collector supply voltages Vcc1 222 and Vcc2 224, as supplied by Vo (FIG. 2). Further, the bias circuit 310 is decoupled from the collector terminals of power transistor 354 and 358.

Further, Vref1 is substantially free of noise, and common to both power amplifiers 220 and 240 (FIG. 2). In one embodiment, reference voltage Vref1 is substantially constant at three volts (±3.0 VDC). Bias circuit 310 comprises diode-configured transistor 312, driver transistors 314 and 316, inductors 322 and 326 (although not shown as encompassed by the dotted block corresponding to 310 for convenience), and constant current source 302. The inductors 322 and 326 are used as low pass filters to pass the bias current and block RF energy to the transistors 354 and 358. Diode-configured transistor 312 is connected as a diode by shorting the collector to the base of diode-configured transistor 312. Diode-configured transistor 312 is matched (i.e., has substantially similar physical and electrical characteristics) to each of driver transistors 314 and 316. Although shown integrated with, or internally coupled to, power amplifier 220, the bias circuit 310 can be externally coupled to power amplifier 220 in some embodiments.

In one embodiment, transistors 312, 314, and 316 are matched, and configured as a current mirror by having their bases connected together. In general, transistors are matched by how much gain they deliver for a defined size. Transistors are typically relatively matched on one die. Matching can be improved by co-locating the transistors very close to each other, thereby minimizing processing variations across a wafer. Thus, the current density (mA/mm) (or ratio of current to device size in millimeters; i.e., if you double the transistor size that transistor will draw twice the current, like having two single devices in parallel) from current source 302 is equal to the current density flowing into the base terminals of driver transistors 314 and 316. By decoupling the bias circuit 310 from the collector terminal of transistors 354 and 358, lower voltages can be employed to power the collector of transistors 354 and 358 without turning off transistors 354 and 358. The substantially constant Vref1 at node 226, in combination with the current mirror and constant current source of the bias circuit 310, provides a substantially constant $I_b$ to the base terminal of each RF power transistor 354 and 358, which results in a substantially constant collector current $I_c$ for each respective collector terminal since $I_c$ is approximately equal to $1+\beta i_b$, where β (beta) is a constant for a particular transistor and called the common-emitter current gain. A substantially constant collector current $I_c$ provides substantially linear operation at low power transistor saturation levels and thus improves efficiency of operation.

Alternatively, although shown and described with BJT transistors, other transistor devices can similarly be employed and configured as current devices to provide a substantially constant source of base current.

FIG. 4 is a block diagram illustrating a second exemplary power amplifying system. The PAS 300 is similar to the power amplifying system shown in FIG. 2. For instance, power amplifiers 420 and 440 of PAS 300 are like the power amplifiers 220 and 240 of the PAS 200 of FIG. 2 but with added enable pins and Vmode pins and added functionality corresponding to these added pins. Also, the power controller 402 (FIG. 4) is like the power controller 202 of FIG. 2 with an added Vref—Isense pin and its corresponding functionality. Consistent with the decoupled bias scheme, Vo at node 218 (Vo supplies voltage to the Vcc1 node 222 and Vcc2 node 224 in FIG. 2) is provided as an input to the collector terminals (not shown, but similar to collector terminals of power transistors 354 and 358 in FIG. 3) of the first and second stage RF power transistors of the power amplifiers 420 and 440. Supply voltage Vo is common to both power amplifiers 420 and 440. In this embodiment, the power controller 402 includes a Vref—Isense pin 422. In other embodiments, the Vref—Isense connection can be made directly to the transceiver controller 480. The power controller 402 provides a relatively constant reference voltage Vref at node 470, of 3.0 VDC, for example, to each power amplifier 420 and 440 via the Vref—Isense 422 pin. Note that Vref is common to both power amplifiers 420 and 440. The reference voltage Vref can be used to sense the output power of the power amplifiers 420 or 440. The "Isense" term in the term "Vref—Isense" denotes that the current consumption ("Iref") of the power amplifier (420 or 440) corresponding to the reference voltage Vref supplied to the bias circuit of the power amplifier 420 or 440 is monitored by the power controller 402, or current monitoring circuitry (as described below) associated with power controller 402, such as by transceiver controller 480. Note that in some embodiments, transceiver controller 480 can be internal to power controller 402. The Vref—Isense pin 422 provides a connection that couples (and thus associates) the constant voltage source located in 408 to the amplifier bias of each power amplifier. Thus, the current draw of the bias circuit of power amplifiers 420 and 440 is proportional to the power output of each of the power amplifiers 420 and 440 of the power amplifying system 300.

Also included with each power amplifier is an optional Vmode pin 434 and 444, respectively, which couples inverted logic circuitry (not shown) to the bias circuit of the power amplifiers 420 and 440 to provide lower supply voltages to the bias circuit at lower power output levels from the power amplifiers 420 and 440. Vmode control changes the biasing of the transistors inside the power amplifiers 420 and 440, thus reducing the overall power consumption at various power level ranges. Enable pins 432 and 442 couple each power amplifier 420 and 440 to a complementary metal oxide (CMOS) or transistor transistor logic (TTL) compliant/compatible enabling input signal based on the application of a predetermined signal, for example, as supplied by the transceiver controller 480 or the baseband subsystem 130 (FIG. 1). Enable pins 402 and 404 thus, in this embodiment, replace the enable function of Vref1 and Vref2 in the power amplifying system of FIG. 2.

Figure 5:
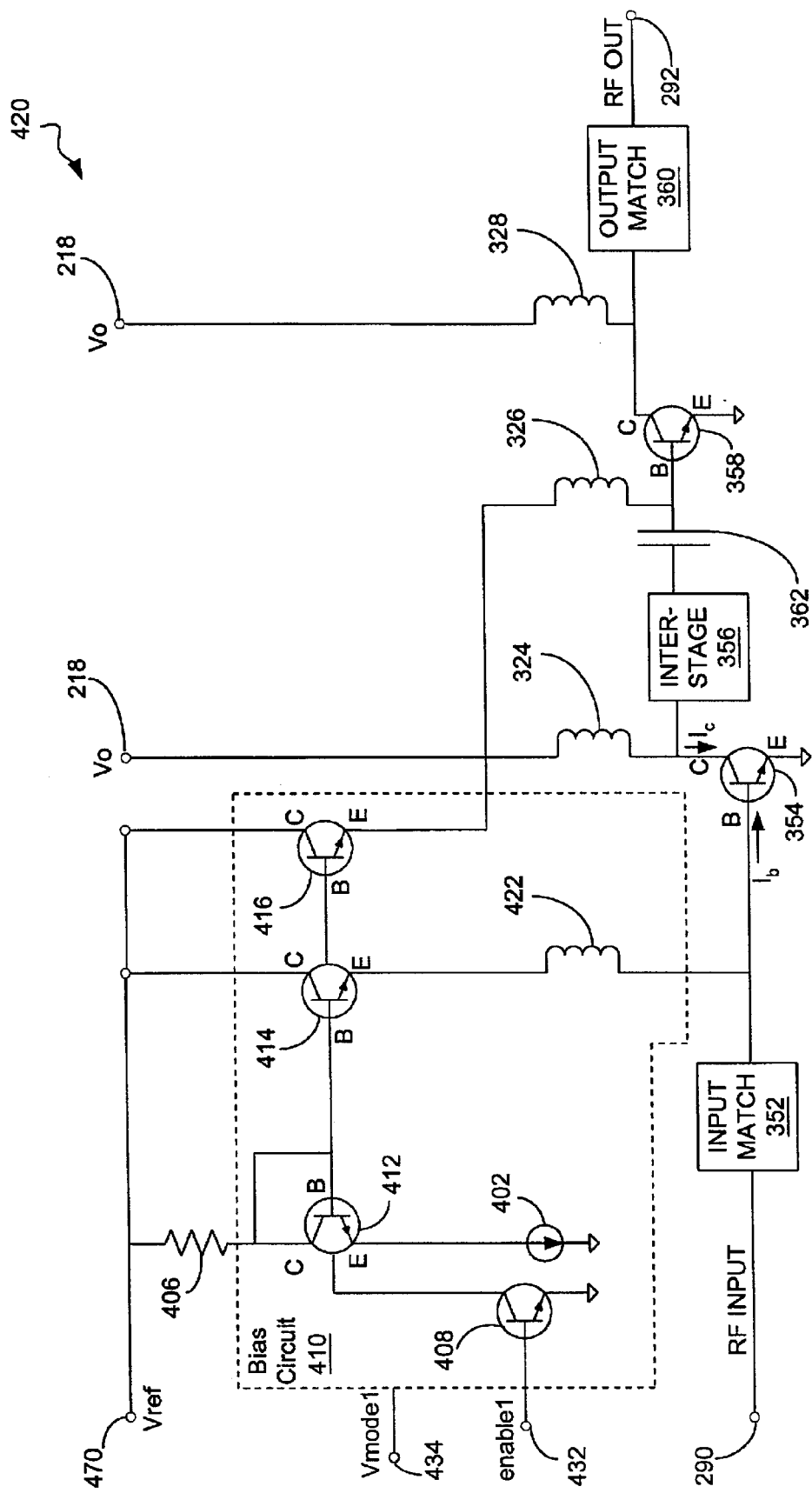
FIG. 5 is a schematic diagram illustrating a bias circuit including an enable pin configuration for one of the power amplifiers of the second exemplary power amplifying system of FIG. 4.

FIG. 5 is a schematic diagram illustrating one exemplary enable pin configuration to a bias circuit 410 of power amplifiers 420 of the second exemplary power amplifying system 300 of FIG. 4, Power amplifier 420 is similar to power amplifier 220 depicted in FIG. 3, but with a bias circuit 410 having an added Vmode1 pin 434 and enable pin 432, and added functionality corresponding to the availability of the Vmode1 pin 434 and enable pin 432. Further, power amplifier 420 replaces Vref1 of FIG. 3 with a Vref common to both power amplifiers 420 and 440, and replaces Vcc1 and Vcc2 of FIG. 3 with Vo. Enable transistor 408 causes the base bias voltage to be shorted to ground therefore turning off transistors 414 and 416. In another embodiment, the enable pin transistor 408 can be removed from its illustrated location in FIG. 5, and placed between the output of the current source 402 and ground.

FIG. 6 is a block diagram illustrating a third exemplary power amplifying system, similar to PAS 300 shown in FIG. 4 but with an added supply voltage control module (SVCM) 610 and without a Vmode pin 434 and 444 (FIG. 4). SVCM 610 is internal to power controller 602, but in other embodiments, can be external to power controller 602. SVCM 610 provides for the "Isense" function associated with supplying "Vref", as explained above. The power amplifying system 400 illustrated in FIG. 6 uses power amplifiers with decoupled bias circuitry, similar to the power amplifier 420 shown in FIG. 5 but without the Vmode1 pin 434. The power controller 602 of FIG. 6 automatically varies the supply voltage Vo, such as supply voltage at node 650, to the collector terminals (not shown, but similar to collector terminals of power transistors 354 and 358 of power amplifier 420 in FIG. 5) of the first and second stage RF transistor collector terminals for the power amplifiers 620. The power controller 602 varies the supply voltage Vo to power amplifiers 620 or 640 based on the current consumption (i.e., the reference current Iref at node 652 as monitored by SVCM 610) of the enabled power amplifier 620 or 640.

FIG. 7 is a detailed block diagram of the power controller 602 of FIG. 6. With continued reference to FIG. 6, the power output of the enabled power amplifier 620 or 640 of FIG. 6 is monitored indirectly by monitoring Iref, since Iref is proportional to the power output of the enabled power amplifier 620 or 640. Note that Iref is the current draw associated with providing a reference voltage to the power amplifiers 620 and 640. In one embodiment, Iref varies between 5 mA to 25 mA. As indicated above, the power controller 602 includes SVCM 610. The SVCM 610 includes a voltage regulator 660 to provide a substantially constant reference voltage, a current meter 662, and a look up table (LUT) 664. The SVCM 610 provides the reference current Iref. Current meter 662 measures, or senses, the DC current flow, Iref, consumed by the enabled power amplifier (620 or 640).

Each power amplifier has a current consumption (Iref), or draw, that varies depending largely on the required power output of each power amplifier. Thus, by monitoring reference current Iref, it is possible to determine the power output of the enabled power amplifier. The measured current value of Iref is supplied to the LUT 664. The LUT 664 provides a data table, or data structure (not shown), that maps the measured current level of reference current Iref to a corresponding logic input value associated with a predetermined supply voltage Vo. This logic input value can be retrieved from the processor 118 (FIG. 1) and input to the voltage controller 608, similar to the mechanism employed by the transceiver controller 280 of FIG. 2. Thus, the supply voltage Vo is a function of the reference current Iref. In one embodiment, the LUT 664 maps 16 states (e.g., 0.5V to 2.2V in 0.10V increments), with lower and upper bounds of 5 mA and 25 mA, respectively. The LUT 664 maps a corresponding Vo of 0.5V and 2.2V, for the 5 mA and 25 mA, respectively. A substantially linear plot of Vo is mapped by the LUT 664 for current levels between 5 mA and 25 mA. The LUT 664 can be incorporated as an integral part of the power controller 602. Alternatively, it may be external to the power controller 602.

Figure 8:
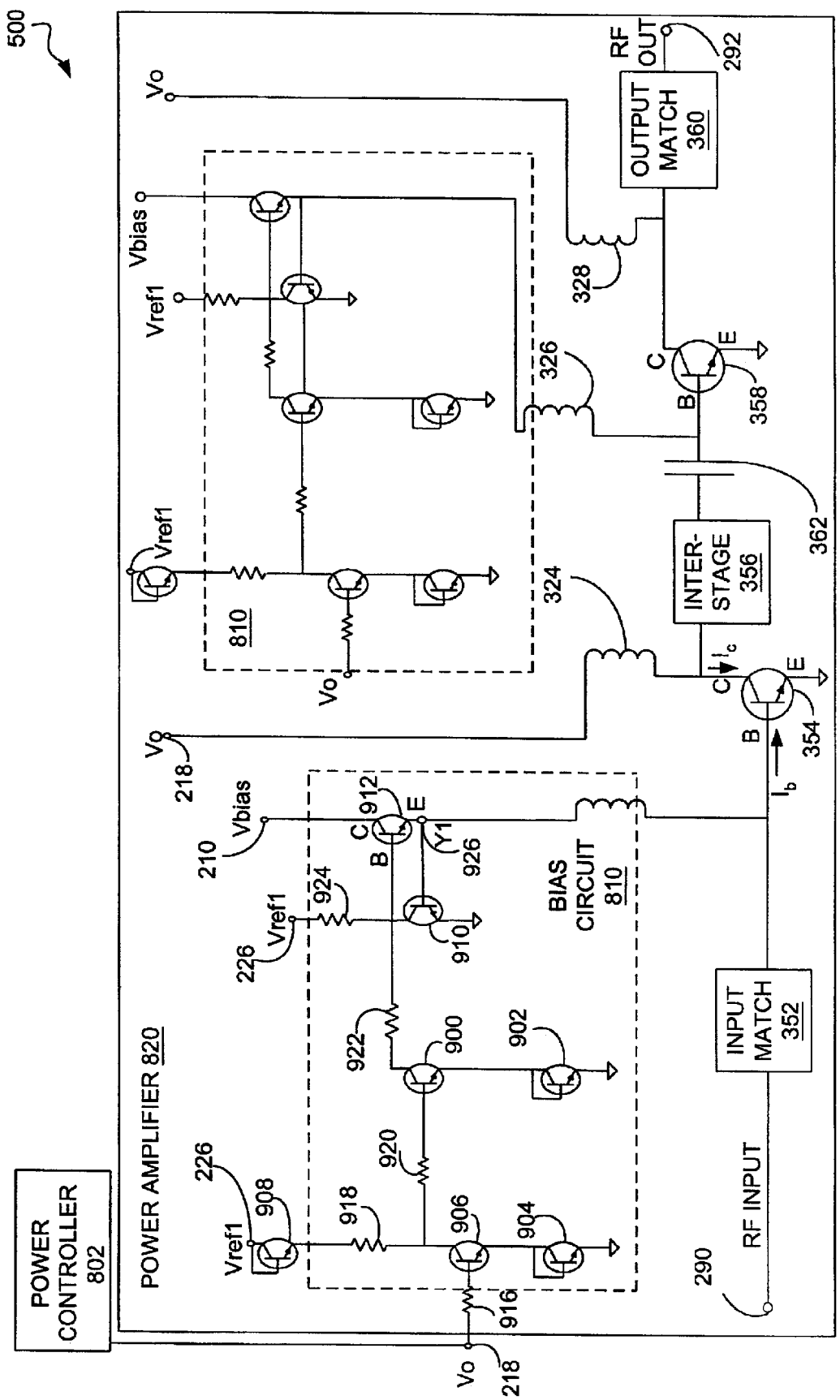
FIG. 8 is a schematic diagram of a fourth exemplary power amplifying system.

FIG. 8 is a schematic diagram of a fourth exemplary PAS 500, with emphasis on the another decoupled bias circuit embodiment. The power controller 802 used to provide a supply voltage Vo to node 218 is similar to the power controller 202 used in FIG. 2. Power controller 802 is depicted as a simplified block diagram, with the battery not shown, to simplify discussion. The bias circuit 810 is duplicated for input into each base terminal of each stage power transistor (e.g., first and second stage RF power transistor 354 and 358). The power amplifier 820 uses the RF circuitry similar to that used for the power amplifier 220 of FIG. 3, including receiving an RF signal at node 290, outputting an amplified RF signal at node 292, and using input match 352, power transistors 354 and 358, interstage matching unit 356, output match 360, and capacitor 362. This bias circuit 810 automatically performs the functionality of the "Iref" sensing and look-up table functionality of the power controller of FIG. 7. Vbias at node 210 represents the voltage at the battery (not shown). Vbias provides for three modes of operation, including "Off", "High-bias", and "Medium-bias." "Medium-bias" will apply when Vmode is enabled, and is valid between the ranges of −100 dBm and 16 dBm. Because the bias voltage on the base of the transistor 354 is, for example, approximately 1.5V, assuming some overhead for the biasing and/or the current source 912, Vbias is typically maintained at a level greater than 2V. As the battery voltage, Vbias, reduces due to reduced power demand by the power amplifier, current from the battery also reduces. Thus a feedback path is established between power consumption of the power amplifier and Vbias.

The supply voltage Vo at node 218 represents the supply voltage of the power controller 802. The reference voltage Vref1 at node 226 represents the reference voltage, which is a regulated voltage of, for example, 3.0 VDC below the float voltage of the battery (not shown). Vref1, as described in relation to FIG. 2, enables or disables the power amplifier. Transistors 900–906, and 910 and 912 comprise a current mirror bias circuit. Diode-configured transistor 908 and transistor 354 are matched and scaled to provide a defined ratio, for example 10:1, of the current drain across the resistor 918. Resistor 924 comprises a reference resistor for transistors 910 and 912, such that resistor 924 is used to set the voltage at the base terminal of the RF power transistor 354. Resistors 924 and 922 comprise a resistor divider network. Transistors 900 and 906 output current levels at voltages established in part by diode-configured transistors 902 and 904, respectively. FIG. 8 illustrates the operations of the supply voltage Vo at or above +3.0 VDC and below 3.0 VDC. At supply voltages Vo equal to and above 3.0 VDC (as a result of an increased demand in power amplifier power output), transistors 906 and 900 are turned on, resulting in an increased voltage supply across resistor 922 and increased current to the base terminal of transistor 912. An increase in current through transistor 912 results in more current into the base terminal of RF power transistor 354. One of the effects of this biasing arrangement is that a change in the supply voltage Vo from the power controller 802 automatically varies the bias current to the base terminal of the RF power transistor 354. In effect, the bias point of the RF power transistor 354 can be continually and automatically adjusted to perform at optimum efficiency.

At a Vo below 3.0 VDC (i.e. lower power controller output voltage Vo due to reduced power output demand of the power amplifier), transistor 906 turns off causing increased current draw through transistor 900 from Vref1 226. This increased current draw through resistor dividers 922 and 924 decreases the current supply to the base terminal of transistor 912, which results in reduced current to the base terminal of RF transistor 354.

The power amplifying systems described above can be implemented in software, hardware, or a combination of software and hardware. In the several embodiments shown and described above, the power amplifiers are implemented in hardware, and the power controller is implemented as a combination of hardware, for example at the regulating circuit, and software, for example at portions of the SCVM 610. The hardware portion of the power amplifying systems can be implemented using specialized hardware logic. The software portion can be stored in a memory and can be executed by a suitable instruction execution system (microprocessor). The hardware implementation of the power amplifying systems can include any or a combination of the following technologies, which are all well known in the art: a discrete logic circuit(s) having logic gates for implementing logic functions upon data signals, an application specific integrated circuit having appropriate logic gates, a programmable gate array(s) (PGA), a field programmable gate array (FPGA), etc.

Furthermore, the power controller software portion of the power amplifying systems (and in the baseband subsystem 130, FIG. 1), which comprise, in part, an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

While various embodiments of the invention have been described, it will be apparent to those of ordinary skill in the art that many more embodiments and implementations are possible that are within the scope of the invention.

What is claimed is:

1. A method for operating a power amplifier, comprising the steps of:

providing a radio frequency (RF) transistor with a base terminal of the RF transistor coupled to a bias circuit;

providing a power controller that couples a supply voltage to a collector terminal of the RF transistor, wherein the collector terminal is decoupled from the bias circuit of the RF transistor; and coupling the bias circuit to a reference voltage that is independent of the supply voltage.

2. The method of claim 1, further comprising the step of monitoring the current draw of the bias circuit with the power controller that is coupling the supply voltage to the collector terminal of the RF transistor.

3. The method of claim 2, further comprising the step of varying the supply voltage of the power controller based on the current draw of the bias circuit.

4. The method of claim 2, further comprising the step of varying the supply voltage of the power controller based on the output power delivered by the power amplifier.

5. The method of claim 4, wherein the output power of the power amplifier is proportional to the current draw of the bias circuit.

6. The method of claim 4, wherein the power controller provides a plurality of output power levels.

7. The method of claim 6, further comprising the step of maintaining a substantially constant bias current to the base terminal of the RF transistor for each output power level delivered by the power amplifier.

8. A method for operating a power amplifier, comprising the steps of:

providing a radio frequency (RF) transistor with a base terminal of the RF transistor coupled to a bias circuit;

providing a collector terminal decoupled from the bias circuit of the RF transistor;

coupling the bias circuit to a reference voltage that is independent of a supply voltage;

coupling the supply voltage to the collector terminal of the RF transistor; monitoring the current draw of the bias circuit with a power controller that is providing the supply voltage to the collector terminal of the RF transistor;

varying the supply voltage of the power controller based on the current draw of the bias circuit;

varying the supply voltage of the power controller based on the output power delivered by the power amplifier, wherein the output power of the power amplifier is proportional to the current draw of the bias circuit, wherein the power controller provides a plurality of output power levels; and maintaining a substantially constant bias current to the base terminal of the RF transistor for each output power level delivered by the power amplifier.

9. A method for operating a power amplifier, comprising the steps of:

providing a radio frequency (RF) transistor with a base terminal of the RF transistor coupled to a bias circuit and a collector terminal decoupled from the bias circuit;

coupling the bias circuit to a reference voltage that enables the power amplifier; coupling the bias circuit and the collector terminal of the RF transistor to a supply voltage; and automatically varying the bias circuit current to the base of the RF transistor based on the change in the supply voltage, such that a bias point of the RF transistor is automatically adjusted as the supply voltage is varied.

10. The method of claim 9, further comprising the step of providing the supply voltage with a power controller.

11. A power amplifying system comprising:

a power amplifier comprising at least one radio frequency (RF) transistor having a base terminal, a collector terminal, and an emitter terminal;

a bias circuit that couples a reference voltage to the base terminal of the RF transistor and provides a substantially constant current to the base terminal of the RF transistor, wherein the bias circuit is further decoupled from the collector terminal of the RF transistor; and a power controller that couples a supply voltage to the collector terminal, the supply voltage independent of the reference voltage, wherein a supply voltage provided by the power controller can be applied to the collector terminal of the RF transistor while maintaining substantially linear operation of the power amplifier.

12. The system of claim 11, wherein the power controller is configured to provide a supply voltage that is independent of the reference voltage, such that the supply voltage is coupled to the collector terminal of the RF transistor and said supply voltage is automatically varied as a function of the bias circuit current drawn at the base terminal of the RF transistor.

13. The system of claim 12, wherein the power controller is further configured to monitor the current draw of the bias circuit.

14. The system of claim 12, wherein the power controller is further configured to vary the supply voltage based on the current draw of the bias circuit.

15. The system of claim 13, wherein the power controller is further configured to vary the supply voltage based on the output power delivered by the power amplifier.

16. The system of claim 14, wherein the output power of the power amplifier is proportional to the current draw of the bias circuit.

17. The system of claim 16 wherein the power controller is configured to provide a plurality of output power levels, current sensing, and look-up table functionality.

18. The system of claim 17, wherein the bias circuit is further configured to maintain a substantially constant bias current to the base terminal of the RF transistor for each output power level delivered by the power amplifier.

19. The system of claim 11, further comprising data structures and operating hardware and operating software for a personal communications device.

20. The system of claim 11, wherein the bias circuit further comprises a constant current source and a current mirror circuit.

21. The system of claim 11, wherein the power amplifier further comprises at least one enable pin that is coupled to an enabling input to turn on the power amplifier.

22. The system of claim 11, further comprising a Vmode pin to provide for lower bias voltages to the power amplifier.

23. A power amplifying system comprising:

a power amplifier comprising at least one radio frequency (RF) transistor having a base terminal, a collector terminal, and an emitter terminal;

a bias circuit that couples a reference voltage to the base terminal of the RF transistor and provides a substantially constant current to the base terminal of the RF transistor, wherein the bias circuit is further decoupled from the collector terminal of the RF transistor such that a supply voltage, that is independent of the reference voltage, can be applied to the collector terminal of the RF transistor while maintaining substantially linear operation of the power amplifier;

a power controller that is configured to provide a supply voltage that is independent of the reference voltage, such that the supply voltage is coupled to the collector terminal of the RF transistor and said supply voltage is automatically varied as a function of the bias circuit current drawn at the base terminal of the RF transistor, wherein the power controller is further configured to monitor the current draw of the bias circuit, wherein the power controller is further configured to vary the supply voltage based on the current draw of the bias circuit, wherein the power controller is further configured to vary the supply voltage based on the output power delivered by the power amplifier, wherein the output power of the power amplifier is proportional to the current draw of the bias circuit, wherein the power controller is configured to provide a plurality of output power levels, current sensing, and look-up table functionality, wherein the bias circuit is further configured to maintain a substantially constant bias current to the base terminal of the RF transistor for each output power level delivered by the power amplifier, wherein the bias circuit further comprises a constant current source and a current mirror circuit, wherein the power amplifier further comprises at least one enable pin that is coupled to an enabling input to turn on the power amplifier, wherein the bias circuit further comprises a driver transistor that delivers a current of substantially equal magnitude to the current provided by the combination of a current mirror source and constant current source of the bias circuit;

data structures and operating hardware and operating software for a personal communications device; and a Vmode pin to provide for lower bias voltages to the power amplifier.

24. A power amplifying system comprising:

a power amplifier comprising at least one radio frequency (RF) transistor having a base terminal, a collector terminal, and an emitter terminal;

a bias circuit that couples an enabling reference voltage to the base terminal of the RF transistor, wherein the bias circuit is decoupled from the collector terminal of the RF transistor; and a power controller that provides a supply voltage to the bias circuit and to the collector terminal of the RF transistor, such that the bias circuit current to the base of the RF transistor automatically varies based on the change in the supply voltage, such that the bias point of the RF transistor is automatically adjusted as the supply voltage is varied.

25. The power amplifying system of claim 24, wherein the bias circuit receives input from the power controller output, from a reference voltage source independent of the supply voltage, and directly from a battery.

26. The power amplifying system of claim 24, wherein the bias circuit comprises transistors configured as a current mirror.

27. The power amplifying system of claim 24, wherein the supply voltage is varied based on the current consumption of the bias circuit.

28. The power amplifying system of claim 24, wherein the current consumption is proportional to the power output of the power amplifier.

29. The power amplifying system of claim 24, further comprising data structures and operating hardware and operating software for a personal communications device.

* * * * *